United States Patent
Sumitani

(10) Patent No.: US 7,583,543 B2
(45) Date of Patent: Sep. 1, 2009

(54) SEMICONDUCTOR MEMORY DEVICE INCLUDING WRITE SELECTORS

(75) Inventor: Norihiko Sumitani, Osaka (JP)

(73) Assignee: Panasonic Corporation, Osaka (JP)

( * ) Notice: Subject to any disclaimer, the term of this patent is extended or adjusted under 35 U.S.C. 154(b) by 84 days.

(21) Appl. No.: 11/898,543

(22) Filed: Sep. 13, 2007

(65) Prior Publication Data

US 2008/0074932 A1    Mar. 27, 2008

(30) Foreign Application Priority Data

Sep. 21, 2006    (JP)    ............................. 2006-256180

(51) Int. Cl.
*G11C 7/00*    (2006.01)

(52) U.S. Cl. ............................. 365/189.14; 365/189.04; 365/189.15; 365/189.16

(58) Field of Classification Search ............ 365/189.05, 365/154, 156, 189.14, 189.15, 189.16, 189.19
See application file for complete search history.

(56) References Cited

U.S. PATENT DOCUMENTS

| | | | | |
|---|---|---|---|---|
| 6,738,282 B2 * | 5/2004 | Jo | ............................... | 365/149 |
| 6,958,507 B2 * | 10/2005 | Atwood et al. | ............... | 257/296 |
| 7,301,793 B2 * | 11/2007 | Kanehara et al. | ............... | 365/63 |
| 2006/0028858 A1 * | 2/2006 | Atwood et al. | ............... | 365/149 |

FOREIGN PATENT DOCUMENTS

JP    2001-093285    4/2001

* cited by examiner

*Primary Examiner*—Tuan T Nguyen
*Assistant Examiner*—Hien N Nguyen
(74) *Attorney, Agent, or Firm*—McDermott Will & Emery LLP

(57) ABSTRACT

A semiconductor memory device includes: static memory cells arranged in a matrix; a read bit line for transmitting data read from one of the memory cells; a write bit line for transmitting data to be written to one of the memory cells; an input data line for transmitting data which is received from outside and is to be written in one of the memory cells; and a selector for selectively transmitting data of the read line or the input data line to the write bit line.

8 Claims, 6 Drawing Sheets

SEMICONDUCTOR MEMORY DEVICE INCLUDING WRITE SELECTORS

BACKGROUND OF THE INVENTION

The present invention relates to a semiconductor memory device including static memory cells arranged in a matrix.

DESCRIPTION OF THE RELATED ART

As a static semiconductor memory device including memory cells arranged in a matrix, for example, a single-end semiconductor memory device which performs data write to a single-ended cell using a single write bit line has been known (see, for example, Japanese Laid-Open Publication No. 2001-93285). More specifically, in a write operation, a write word line is activated and a write bit line is made to have a corresponding potential to data to be written. Then, a potential state of the write bit line is written as it is to a memory cell.

In the above-described semiconductor memory device, however, when a single word line is activated, in all corresponding columns, data corresponding to a potential of each write bit line is written to an associated one of memory cells.

Accordingly, data write in a unit of a predetermined number of columns, i.e., write of data having a predetermined bit width can not be performed. Also, rewrite of data for only part of bits can not be performed. Moreover, with reduction of the design rules and the like, a similar problem becomes apparent not only in a single-end type semiconductor memory device but also in a differential write line semiconductor memory device.

SUMMARY OF THE INVENTION

In view of the above-described point, it is therefore an object of the present invention to allow rewrite to only part of memory cells which are connected to an activated word line in a simple manner, thereby performing, in a simple manner, data write in a column unit, for example, in a single-end semiconductor memory device including static memory cells, or the like.

To solve the above-described problems, a semiconductor memory device according to the present invention is characterized by including: static memory cells arranged in a matrix; a read bit line for transmitting data read from one of the memory cells; a write bit line for transmitting data to be written to one of the memory cells; an input data line for transmitting data which is received from outside and is to be written to one of the memory cells; and a selector for selectively transmitting data of the read line or the input data line to the write bit line.

Thus, input data is written in a memory cell in a selected column of which an input data line is selected by a selector and data stored in advance is written back and a stored content is maintained in a memory cell in a column of which read line is selected by a selector.

DESCRIPTION OF THE PREFERRED EMBODIMENTS

Figure 1:
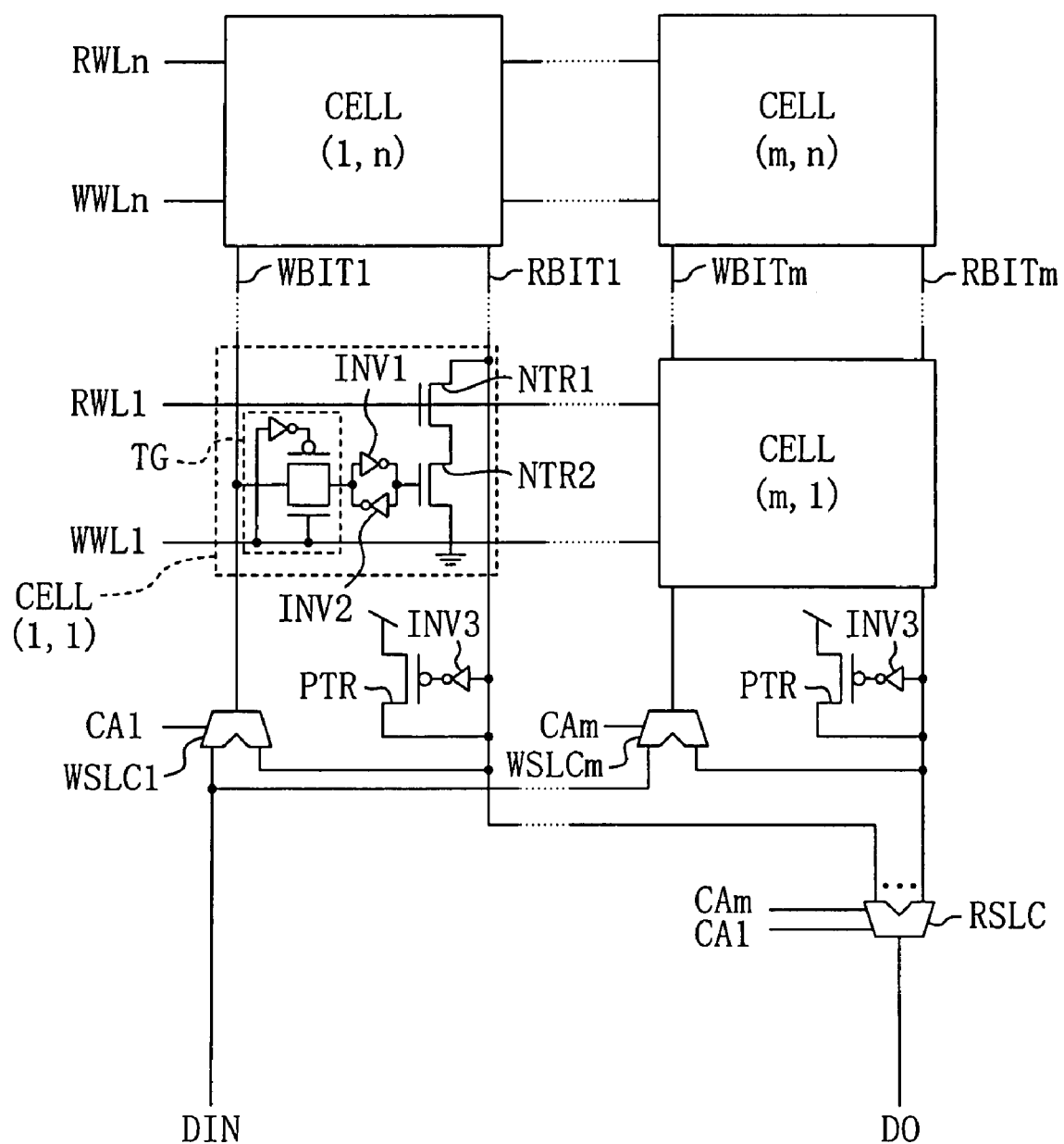
FIG. 1 is a circuit diagram illustrating a configuration of a semiconductor memory device according to Embodiment 1 of the present invention.

Hereafter, embodiments of the present invention will be described in detail based on the accompanying drawings. In the following embodiments, each member having the same function is identified by the same reference numeral and therefore the description thereof will be omitted. For the sake of simplicity, the description of the normal read operation will be omitted.

Embodiment 1

FIG. 1 is a circuit diagram illustrating a configuration of a semiconductor memory device according to Embodiment 1 of the present invention.

In FIG. 1, CELL(1, 1) through CELL(m, n) denotes memory cells arranged in a matrix of n rows and m columns. Each of the memory cells includes two inverters INV1 and INV2 for statically storing (latching) data, a transfer gate TG for controlling data write, and two N-channel transistors NTR1 and NTR2 for controlling read of stored data.

WBIT1 through WBITm denote write bit lines for transmitting data to be written to a memory cell.

RBIT1 through RBITm denote read bit lines for transmitting data which has been read from a memory cell.

WWL1 through WWLn denote write word lines for specifying a memory cell to which data is written. One of the write word lines WWL1 through WWLn becomes an H (high) level, for example, based on an address signal (not shown) which has been specified from the outside of the semiconductor memory device. Thus, in each of corresponding memory cells, a signal corresponding to a level of an associated one of write bit lines WBIT1 through WBITm is latched by the inverters INV1 and INV2 via the transfer gate TG.

RWL1 through RWLn denotes read word lines for specifying a memory cell from which data is read. In the same manner as in the case of the write word lines WWL1 through WWLn, one of the read word lines RWL1 through RWLn becomes the H level, for example, based on an address signal (not shown). Then, for each of corresponding memory cells, charges which have been precharged in an associated one of read bit lines RBIT1 through RBITm are retained or discharged according to a signal level latched in the inverters INV1 and INV2.

WSLC1 through WSLCm are write selectors for selecting, when data is written, which write of data received from the outside of the semiconductor memory device or re-write of data to be read from each cell is to be executed according to column select signals CA1 through CAm. More specifically, for example, a write selector WSLC1 selects one of an input data line DIN and the read bit line RBIT1 to connect the selected one to the write bit line WBIT1. Other write selectors such as the write selector WSLCm operates in the same manner.

The column select signals CA1 through CAm are generated, for example, based on an address signal externally specified (or part of the address signal used as it is or the part of the address signal is decoded and then used). Then, at the H level, the input data line DIN is connected to the write bit line WBIT1 or the like and, on the other hand, at the L level, the read bit lines RBIT1 through RBITm are connected to the write bit lines WBIT1 through WBITm, respectively. As the column select signals CA1 through CAm, a signal directly received from the outside of the semiconductor memory device or a decoded signal of such a signal may be used. For example, using, as a column select signal, a logical AND of a column address and a bit write enable signal instructing partial write for the semiconductor memory device, a bit write function can be realized.

RSLC denotes a read selector for selecting, when data is read, one of data which have been read from memory cells according to the column select signals CA1 through CAm and outputting the selected data to an output data line DO. More specifically, one of the read bit lines RBIT1 through RBITm is selected and the selected one is connected to the output data line DO.

Each of inverters INV3 and P-channel transistors PTR connected to an associated one of the read bit lines RBIT1 through BRITm is provided to compensate a leakage current from the read bit line when a potential of the bit line is the H level and retain the read bit line at the H level.

Moreover, in the semiconductor memory device, for example, a precharge circuit (not shown) is provided, so that when none of the read word lines RWL1 through RWLn and the write word lines WWL1 through WWLn is activated (at the L level), the read bit lines RBIT1 through RBITm are precharged to be, for example, a power source potential.

The operation of the semiconductor memory device formed so as to have the above-described configuration will be described. Herein, in the following description, it is assumed that when a signal latched in each of the memory cells CELL(1, 1) through CELL(m, n) is a signal for retaining charges of precharged read bit lines RBIT1 through RBITm, "1" is stored and, when the signal latched in each of the memory cells CELL(1, 1) through CELL(m, n) is a signal for discharging charges of the read bit lines RBIT1 through RBITm, "0" is stored.

Figure 2:
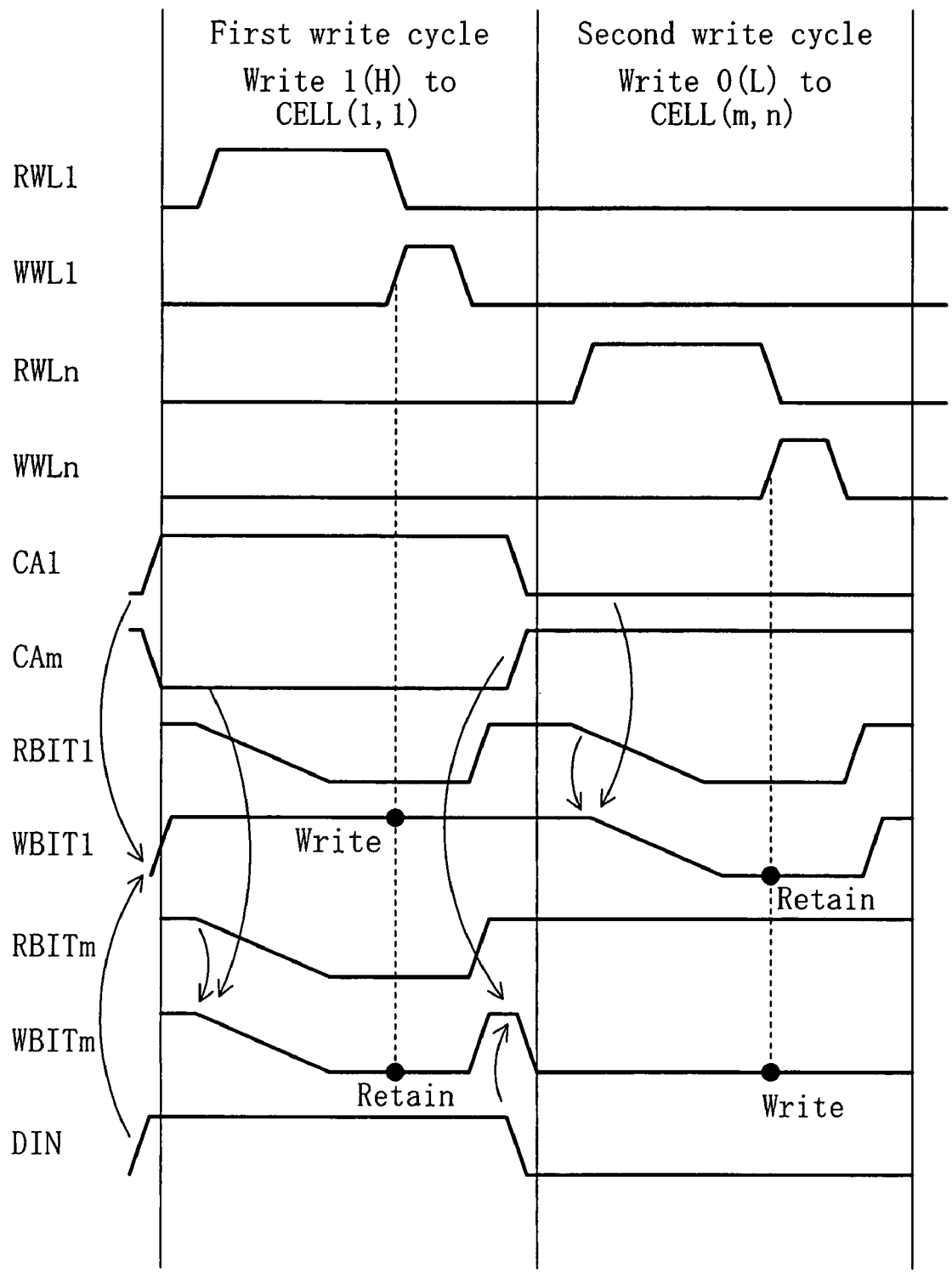
FIG. 2 is a timing chart illustrating a write operation according to Embodiment 1.

Hereafter, a specific example of a write operation will be described with reference to a timing chart shown in FIG. 2. In this example, the following case will be described. In a state where "0" is stored in the memory cells CELL(1, 1), CELL(m, 1) and CELL(1, n) and "1" has been stored in the memory cell CELL(m, n) in advance of an operation, "1" is written to the memory cell CELL(1, 1) in a first write cycle and "0" is written to the memory cell CELL(m, n) in a second write cycle.

(Before First Write Cycle)

First, in advance of a first write cycle (i.e., when the read word lines RWL1 through RWLn and the write word lines WWL1 through WWLn are all at the L level), the read bit lines RBIT1 through RBITm are precharged to be the power source potential. Moreover, in the following first write cycle, before one of the read word lines RWL1 through RWLn becomes the H level, only the column select signal CA1 is set to be the H level and the others are set to be the L level.

(First Write Cycle)

When data write to the memory cell CELL(1, 1) is performed, first the read word line RWL1 is set to be the H level and stored contents in the memory cells CELL(1, 1) and CELL(m, 1) are read by the read bit lines RBIT1 and RBITm. In this case, since "0" is stored in the memory cells, charges which have been precharged in the read bit lines RBIT1 and RBITm are discharged and the read bit lines RBIT1 and RBITm is gradually reduced to the L level.

However, for the memory cell CELL(1, 1) to which data is written, since the column select signal CA1 is set to be the H level, the input data line DIN is selected by the write selector WSLC1 and the write bit line WBIT1 becomes a corresponding level to the input data line DIN despite the level of the read bit line RBIT1.

On the other hand, since the memory cell CELL(m, 1) to which data is not written, since the column select signal CAm is set to be the L level, the read bit line RBITm is selected by the write selector WSLCm and the write bit line WBITm becomes the L level, which is the same level as the read bit line RBITm.

Then, when the write word line WWL1 is set to be the H level for a predetermined period of time, "1" which is to be received from the input data line DIN is written to the memory cell CELL(1, 1) and, on the other hand, "0" which has been stored in the memory cell CELL(m, 1) in advance is overwritten in the memory cell CELL(m, 1) (i.e., a stored content is written back and retained).

That is, a write operation is actually performed to all of the memory cells CELL(1, 1) through CELL(m, 1) located in a row selected by the write word line WWL1 but, in consequence of the write operation, only the memory cell CELL(1, 1) located in a column selected by the column select signal CA1 is overwritten to data received from the input data line DIN.

When the write word line WWL1 is returned to the L level, the read bit lines RBIT1 through RBITm are precharged again to the power source potential for a next write cycle. To write data to the memory cell CELL(m, n) next, the column select signal CA1 is set to be the L level and the column select signal CAm is set to be the H level.

(Second Write Cycle)

When data is written to the memory cell CELL(m, n) subsequently, the read word line RWLn is set to be the H level and stored contents of the memory cells CELL(1, n) and CELL(m, n) are read to the read bit lines RBIT1 and RBITm. In this case, since "0" and "1" are stored in the memory cells, charges which have been precharged in the read bit line RBIT1 are discharged and the read bit line RBIT1 is gradually reduced to the L level in the same manner as in the first write cycle and charges which have been precharged in the read bit line RBITm are retained and the read bit line RBITm is kept at the H level.

In this write cycle, the column select signal CA1 is set to be the L level and the column select signal CAm is set to be the H level. Thus, the read bit line RBIT1 is selected by the write selector WSLC1 and the input data line DIN is selected by the write selector WSLCm.

Then, when the write word line WWLn is set to be the H level for a predetermined period of time, "0" which has been stored in the memory cell CELL(1, n) in advance is written back to the memory cell CELL(1, n) and "0" which is received from the input data line DIN is written to the memory cell CELL(m, n).

That is, in the same manner as in the first write cycle, data is overwritten only in the memory cell CELL(m, n) further selected by the column select signal CAm from the memory cells CELL(1, n) through CELL(m, n) located in a row selected by the write word line WWLn.

As has been described, for memory cells located in a memory cell row to which data is to be written and also located in a non-selected column, first, the read word lines RWL1 through RWLn are activated and stored contents are read to the read bit lines RBIT1 through RBITm. Then, the stored contents are transmitted to the write bit lines WBIT1 through WRBITm via the write selector WSLC1 through WSLCm and are written again (write back). Thus, new data can be written only in one memory cell located in a selected column without destroying data stored in the memory cells in the non-selected column. Specifically, even in a single-end static RAM which can realize reduction in semiconductor chip area and increase of output ports in a relatively simple manner, the same column construction as that for a typical static RAM including a six-transistor memory cell can be formed and also a write operation to a memory cell located in a specific row and a specific column can be performed in a simple manner.

Therefore, for example, if a bit number of data to be read/write at a time and a total memory capacity is the same, the number of columns (i.e., the number of memory cells in the row direction) can be increased and the number of memory cells in the column direction can be reduced so that parasitic capacitances of bit lines can be suppressed to a low level in a simple manner. Accordingly, a read speed can be improved, the size of a memory cell (transistor) can be reduced, so that a semiconductor chip area can be further reduced and a memory capacitance can be further increased.

As has been described, application of the above-described configuration is not limited to a single-end RAM. The configuration in which write back is performed may be applied to a semiconductor memory device using a six-transistor memory cell in the same manner as in this embodiment. Specifically, in such a so-called differential write line semiconductor memory device, when miniaturization of the design rules, reduction in voltage and the like are intended, stored contents of cells in a column in which data is not overwritten can be reliably retained in a simple manner.

Embodiment 2

Figure 3:
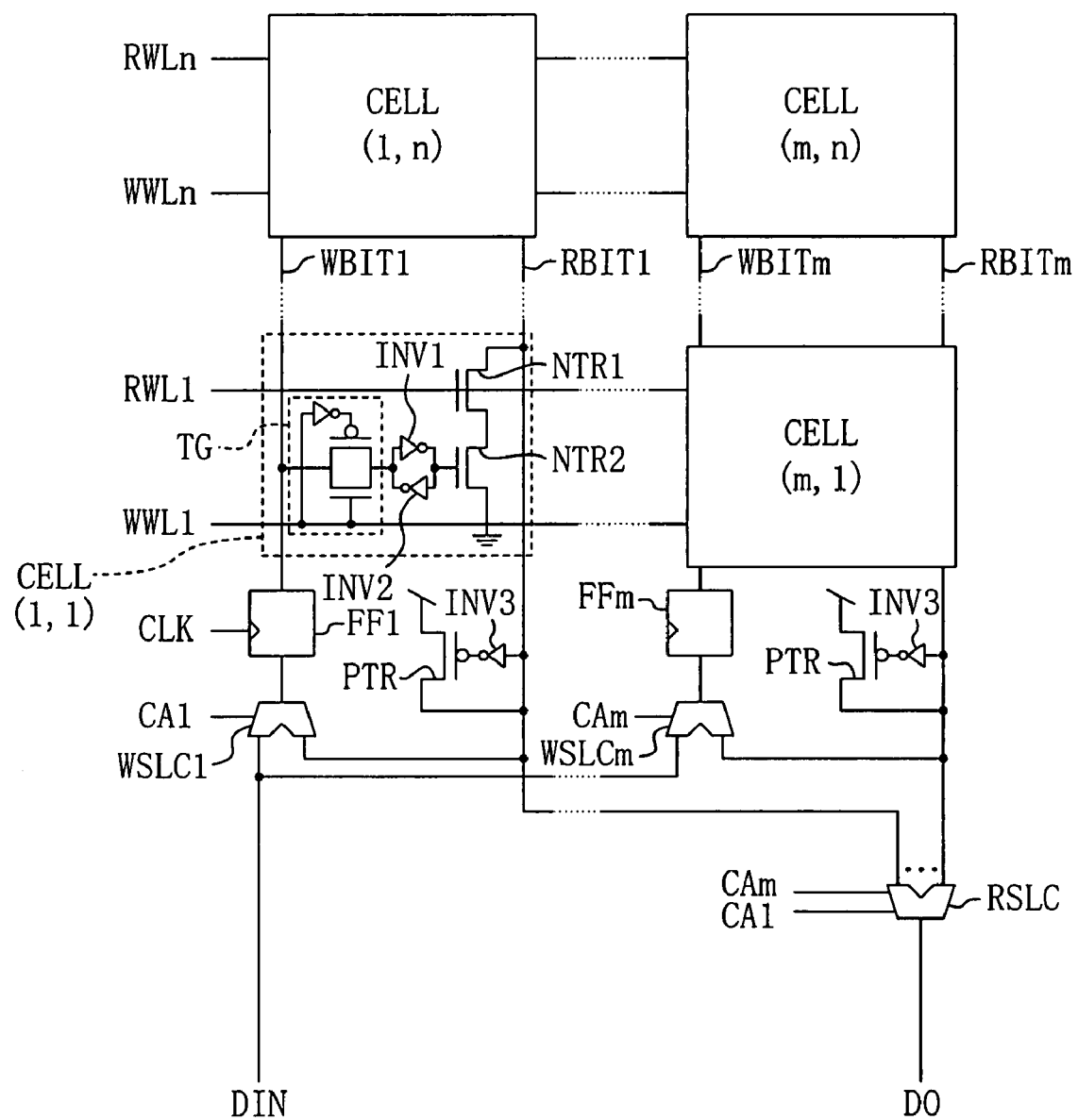
FIG. 3 is a circuit diagram illustrating a configuration of a semiconductor memory device according to Embodiment 2 of the present invention.

FIG. 3 is a circuit diagram illustrating a configuration of a semiconductor memory device according to Embodiment 2 of the present invention.

Compared to the configuration of Embodiment 1, the semiconductor memory device of this embodiment is different in that flipflops FF1 through FFm are provided. Each of the flipflops FF1 through FFm is configured to retain (update) a level of a signal output from an associated one of the write selectors WSLC1 through WSLCm at a fall of a clock signal CLK and to output the level of the signal to an associated one of the write bit lines WBIT1 through WBITm.

In Embodiment 2, a basic write operation using write back is performed in the same manner as in Embodiment 1. However, as described above, with the flipflops FF1 through FFm provided, power consumption when write data right before a write operation is "0" and data to be subsequently written back is "0" can be suppressed to a low level. Specifically, when data to be continuously written back is "0", the read bit lines RBIT1 through RBITm become to be the H level once due to precharge and then become the L level due to discharge. In this case, when the level of the write bit lines WBIT1 through WBITm is changed in the same manner, power consumption is further increased due to charge and discharge. However, as described above, the flipflops FF1 through FFm are provided and the level of the write bit lines WBIT1 through WBITm is retained at the level right before the operation, thereby suppressing waste of power consumption due to the change of the level.

Figure 4:
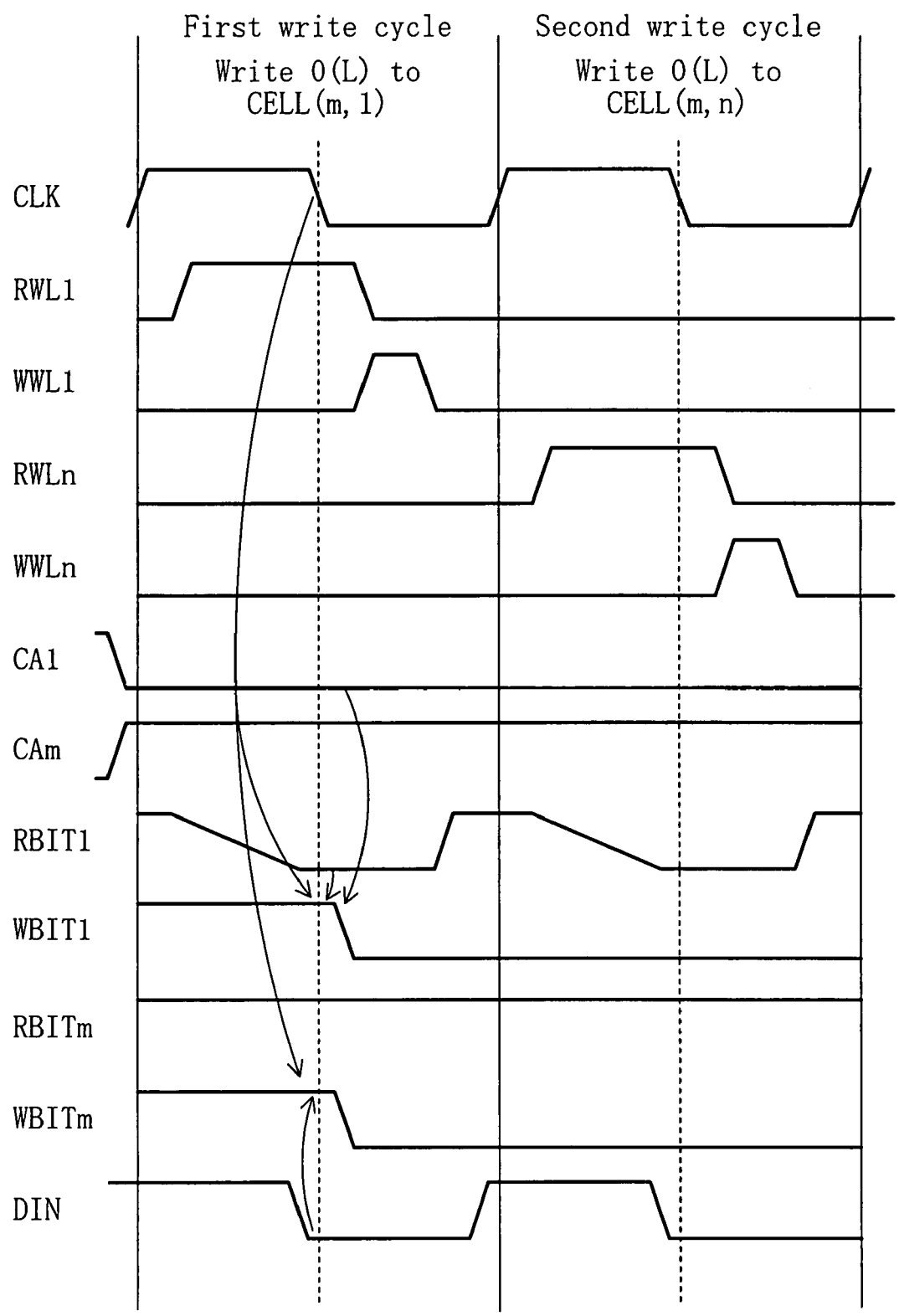
FIG. 4 is a timing chart illustrating a write operation according to Embodiment 2.

Hereafter, a specific write operation will be described based on a timing chart shown in FIG. 4. In the following example, the case where in a state where "0" is stored in the memory cells CELL(1, 1) and CELL(1, n) and "1" is stored in the memory cells CELL(m, 1) and CELL(m, n) in advance of an operation, "0" is written in the memory cell CELL(m, 1) in a first write cycle and then "0" is written in the memory cell CELL(m, n) in a second write cycle will be described.

(Before First Write Cycle)

As in Embodiment 1, before a first write cycle, the read bit lines RBIT1 through RBITm are precharged to the power source potential. Moreover, only the column select signal CAm is set to be the H level.

(First Write Cycle)

When data write to the memory cell CELL(m, 1) is performed, first, the read word line RWL1 is set to be the H level and stored contents in the memory cells CELL(1, 1) and CELL(m, 1) are read to the read bit lines RBIT1 and RBITm. In this case, since "0" and "1" are stored in memory cells CELL(1, 1) and CELL(m, 1), charges which have been precharged in the read bit line RBIT1 are discharged and the read bit line RBIT1 is gradually reduced to the L level, while charges which have been precharged in the read bit line RBITm are retained and the read bit line RBITm is kept at the H level.

The write selector WSLC1 selects the read bit line RBIT1 according to the column select signal CA1 of the L level, while the write selector WSLCm selects an input data line DIN according to the column select signal CAm of the H level. Outputs of the write selectors WSLC1 through WSLCm are received by the flipflops FF1 through FFm, respectively, are updated at a time of a fall of the clock signal CLK and are transmitted to the write bit lines WBIT1 and WBITm. Then, since a content stored in advance is "0" in the memory cell CELL(1, 1), the write bit line WBIT1 becomes the L level. Moreover, since data received from the input data line DIN is "0", the write bit line WBITm becomes the L level.

Next, when the write word line WWL1 is set to be the H level for a predetermined period of time, "0" stored in advance is written back to the memory cell CELL(1, 1) and "0" received from the input data line DIN is written to the memory cell CELL(m, 1).

That is, as in Embodiment 1, only the memory cell CELL(m, 1) located in a column selected by the column select signal CAm from the memory cells CELL(1, 1) through CELL(m, 1) and also located in a row selected by the write word line WWL1 is overwritten.

When the write word line WWL1 is returned to the L level, the read bit lines RBIT1 through RBITm are precharged again to the power source potential for a next write cycle. Since data is written to the memory cell CELL(m, n) next, the column select signal CA1 is set to be the L level and the column select signal CAm is set to be the H level.

(Second Write Cycle)

When data write to the memory cell CELL(m, n) is performed, the read word line RWLn is set to be the H level and stored contents in the memory cell CELL(1, n) and CELL(m, n) are read to the read bit lines RBIT1 through RBITm. In this case, since "0" and "1" are stored in the memory cells, charges which have been precharged in the read bit line RBIT1 are discharged and the read bit line RBIT1 is gradually reduced to the L level in the same manner as in the first write cycle and charges which have been precharged in the read bit line RBITm are retained and the read bit line RBITm is kept at the H level.

The write selectors WSLC1 and WSLCm select the read bit line RBIT1 and the input data line DIN, respectively. An output level of the write selector WSLC1 is changed due to precharge and discharge of the read bit line RBIT1 and an output level of the write selector WSLCm is changed due to change of the level of the input data line DIN. However, since outputs of the write selectors WSLC1 and WSLCm are connected to the write bit lines WBIT1 and WBITm via the flipflops FF1 and FFm, respectively, levels of the write bit line WBIT1 and WBITm are not changed.

When the clock signal CLK falls, the outputs of the write selectors WSLC1 and WSLCm are transmitted to the write bit lines WBIT1 and WBITm via the flipflops FF1 and FFm. Then, since a content stored in the memory cell CELL(1, n) in advance is "0", the write bit line WBIT1 is retained to be the L level. Since the input data line DIN is "0", the write bit line WBITm is also retained to be the L level.

Specifically, even if the read bit line RBIT1 once becomes the H level due to precharge in reading the stored content of the memory cell CELL(1, n), the level of a signal output from the flipflop FF1 to the write bit line WBIT1 is not changed from the L level as long as the read bit line RBITm is discharged to be the L level when the clock signal CLK falls. Moreover, even if the input data line DIN becomes the H level once at an initial stage of a write cycle, the level of a signal output from the flipflop FFm to the write bit line WBITm is not changed from the L level as long as the input data line DIN is the L level at the timing of fall of the clock signal. Therefore, power consumption due to potential change of the write bit lines WBIT1 through WBITm can be avoided.

Next, as in the first write cycle, when the write word line WWLn is set to be the H level for a predetermined period of time, "0" stored in advance is written back to the memory cell CELL(1, n) and "0" received from the input data line DIN is written to the memory cell CELL(m, n).

That is, as in Embodiment 1, only the memory cell CELL(m, n) located in a column selected by the column select signal CAm from the memory cells CELL(1, n) through CELL(m, n) and also located in a row selected by the write word line WWLn is overwritten.

As described above, because the flipflops FF1 through FFm are provided, for example, in the case where "0" is written back to the memory cell CELL(1, 1) in the first write cycle and then "0" is written back to the memory cell CELL(1, n) in the second write cycle, the write bit line WBIT1 is kept to be the L level despite precharge of the read bit line RBIT1. Thus, undesired change of the level of the write bit lines WBIT1 through WBITm can be suppressed, so that power consumption can be kept at a low level. Specifically, in a large capacity memory macro, since an interconnect length for a write bit line is large and a parasitic capacitance tends to be large, a great effect of reducing power consumption can be achieved in a simple manner.

Update of a signal level retained in a flipflop and the like in the above-described manner may be performed only in a write cycle and not performed in a read cycle. Thus, power consumption due to transition of a write bit line potential in a read cycle can be avoided. Specifically, for example, a flipflop having an enable function may be used to activate an enable signal only in a write cycle and to supply a clock signal only in a write cycle.

Location of each of the flipflops FF1 through FFm is not limited to an output side of an associated one of the write selectors WSLC1 through WSLCm. Each of the flipflops FF1 through FFm may be provided at an input side of an associated one of the write selectors WSLC1 through WSLCm. Moreover, each of the flipflops FF1 through FFm is not limited to a flipflop which retains an input signal level at timing synchronized with a clock edge. A latch for retaining a level of an input signal right before a write operation while a control signal is at a predetermined level may be used.

Embodiment 3

The above-described configuration in which a content stored in advance is written back to a memory cell to which rewrite of the stored content is not performed may be applied to a multi-port memory.

Figure 5:
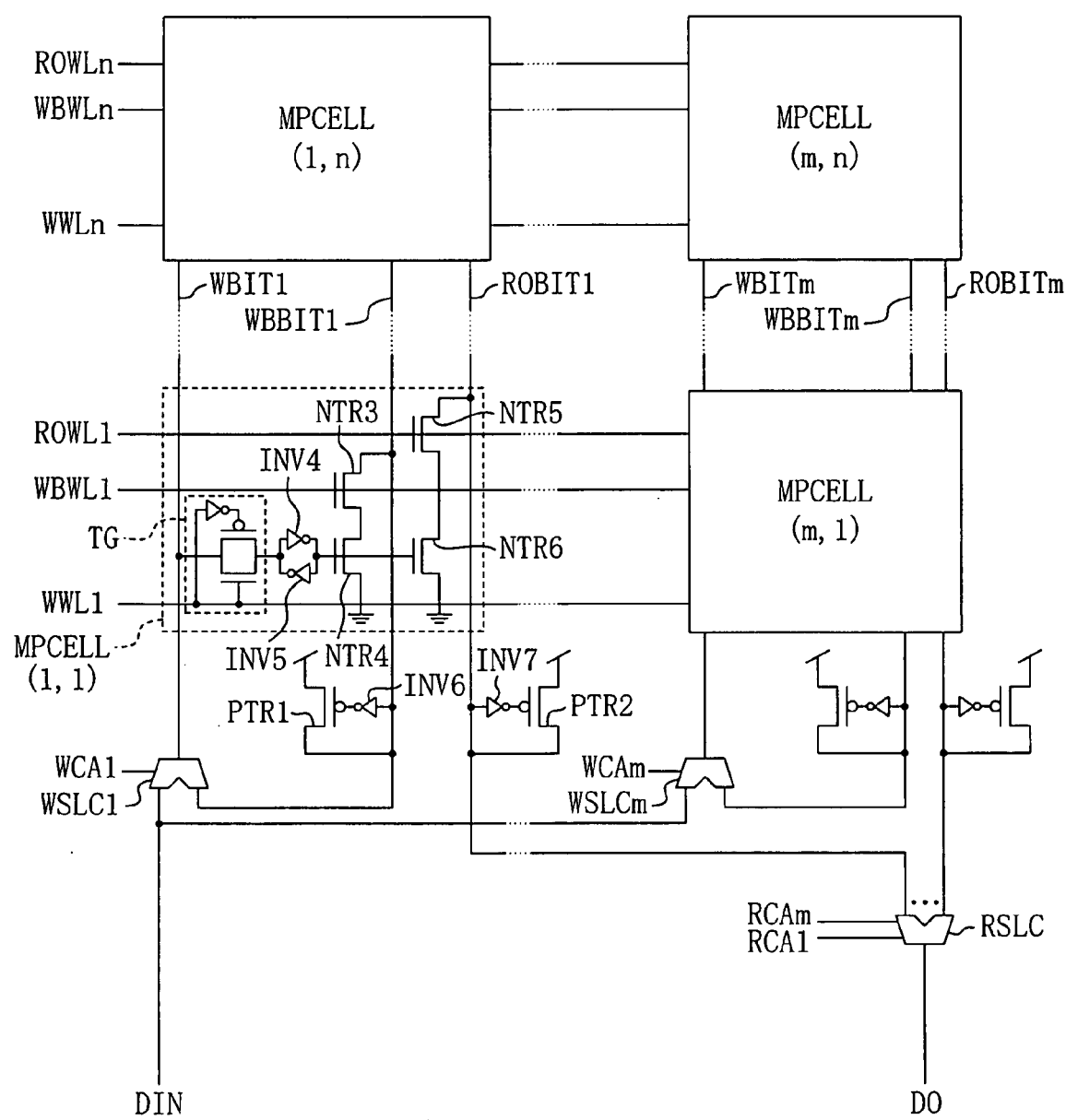
FIG. 5 is a circuit diagram illustrating a configuration of a semiconductor memory device according to Embodiment 3 of the present invention.

FIG. 5 is a circuit diagram illustrating a configuration of a semiconductor memory device (multi-port memory) which can perform simultaneously write of data to one memory cell and read of data stored in another memory cell (to the outside of the semiconductor memory device).

Compared to the semiconductor memory device of Embodiment 1, the semiconductor memory device of this embodiment is different in that memory cells MPCELL(1, 1) through MPCELL(m, n) are provided, instead of the memory cells CELL(1, 1) through CELL(m, n). Instead of the read bit lines RBIT1 through RBITm of Embodiment 1 for use in both of write back and read, write back bit lines WBBIT1 through WBBITm for use only in write back and read only bit lines ROBIT1 through ROBITm for use only in read is connected to the memory cells MPCELL(1, 1) through MPCELL(m, n), respectively. In the same manner, instead of the read word lines RWL1 through RWLm for use of both of read and write, write back word lines WBWLm through WBWLn for use only in write back and read only word lines ROWLm through ROWLn for use only in read are connected, respectively. Moreover, instead of the N-channel transistors NTR1 and NTR2, N-channel transistors NTR3, NTR4, NTR5 and NTR6 are provided.

Inverters INV4 and INV5, P-channel transistors PTR1 and PTR2 and inverters INV6 and INV7 have the same function as those of the inverters INV1 and INV2, the P-channel transistor PTR and the inverter INV3 of Embodiment 1, respectively. The same write selectors WSLC1 through WSLCm and the read selector RSLC as those in Embodiment 1 are provided. However, the write selectors WSLC1 through WSLCm and the read selector RSLC are independently selective-controlled by write column select signals WCA1 though WCAm and read column select signals RCA1 through RCAm.

The semiconductor memory device having the above-described configuration has the same mechanism as Embodiment 1, in which only a memory cell in part of a selected column can be overwritten. Specifically, when one of the write back write back word lines WBWL1 through WBWLn becomes the H level, data stored in each memory cell in a corresponding row is read to the write back bit line WBBIT1 through WBBITm. Then, data in a non-selected column where an associated one of the write column select signals WCA1 through WCAm is the L level is transmitted to the write bit lines WBIT1 through WBITm via an associated one of the write selectors WSLC1 through WSLCm, thereby writing back the data. Then, data retained in memory cells in the non-selected column are maintained and only a memory cell in a selected column is overwritten to data received from the input data line DIN.

One of the read only word lines ROWL1 through ROWLn is set to be the H level independently from the write back write back word lines WBWL1 through WBWLn, so that data stored in memory cells in a corresponding row is transmitted to the read only bit lines ROBIT1 through ROBITm and then data corresponding to read column select signals RCA1 through RCAm are selected by the read selector RSLC and are read to the outside of the semiconductor memory device.

Thus, read of data stored in a memory cell selected by the read only word lines ROWL1 through ROWLn and the read column select signals RCA1 through RCAm from the output data line DO can be performed at the same time as write of data received from the input data line DIN to only a memory cell which is one of the memory cells MPCELL(1, 1) through MPCELL(m, n) and is connected to one of the word lines WWL1 through WWLn is performed in the manner of Embodiment 1.

In the above-described configuration, the transistor size of the N-channel transistors NTR3 and NTR4 connected to write back bit lines WBBIT1 through WBBITm may be smaller than the transistor size of the N-channel transistors NTR5 and NTR6. Specifically, when write back is performed, the potential of the write bit lines WBIT1 through WBITm does not have to be fully swung between a ground potential and a power source potential, or the like, but may be a potential at which inversion of data stored in a memory cell is not caused. Therefore, even if a rate of potential drop for charges which have been precharged in the write back bit lines WBBIT1 through WBBITm is lower than a potential drop rate for the read only bit lines ROBIT1 through ROBITm, within the range where write back is properly performed, the transistor size of the N-channel transistor NTR3 and NTR4 can be reduced to achieve reduction in area.

Embodiment 4

Figure 6:
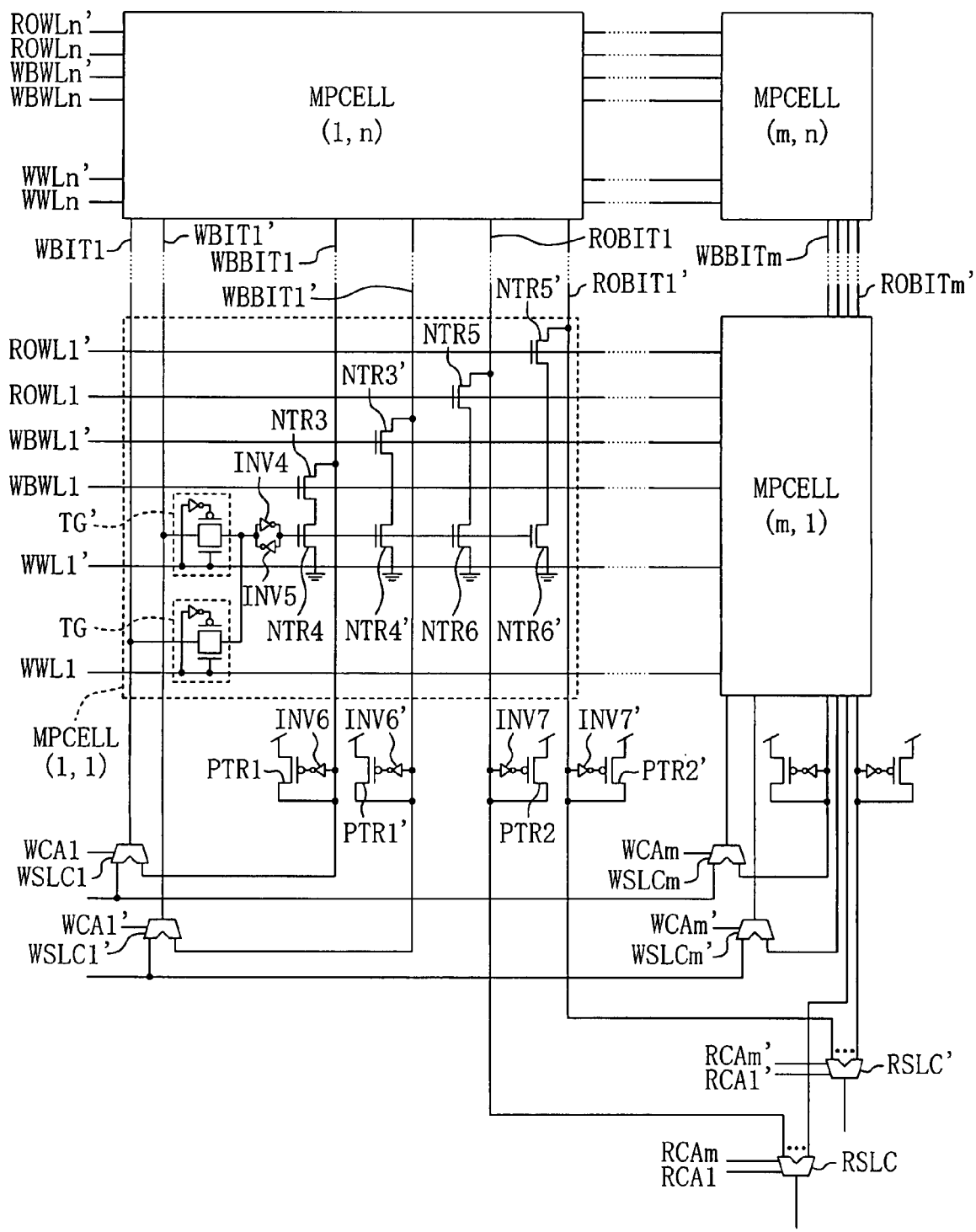
FIG. 6 is a circuit diagram illustrating a configuration of a semiconductor memory device according to Embodiment 4 of the present invention.

FIG. 6 is a circuit diagram illustrating a configuration of a semiconductor memory device which can simultaneously perform data write to two different memory cells and read of data stored in two different memory cells.

In the semiconductor memory device, two sets of input/output circuits are provided for each latch (including inverters INV4 and INV5) of Embodiment 3. Specifically, two sets of the following members are provided (note that in FIG. 6, each member of a second set is denoted by a reference numeral with a prime '). The members are: write back bit lines WBBIT1 through WBBITm; read only bit lines ROBIT1 through ROBITm; write back write back word lines WBWL1 through WBWLm; read only word lines ROWL1 through ROWLn; N-channel transistors NTR3 through NTR6; P-channel transistors PTR1 and PTR2; inverters INV6 and INV7; write selectors WSLC1 through WSLCm; write bit lines WBIT1 through WBITm; write word lines WWL1 through WWLn; a transfer gate TG; and a read selector RSLC.

With the above-described configuration, for example, data can be simultaneously written to two memory cells selected by the write word lines WWL1 through WWLn, the write word lines WWL1' through WWLn', the write column select signals WCA1 through WCAm and the write column select signals WCA1' and WCAm' via two of the write bit lines WBIT1 through WBITm and the write bit lines WBIT1' through WBITm'. At that time, data stored in a memory cell to which data write is not performed is maintained by write back via the write back bit lines WBBIT1 through WBBITm and the write back bit lines WBBIT1' through WBBITm'. This point is the same as in each of the above-described embodiments.

In the semiconductor device, at the same time as the above-described data write is performed, data stored in two memory cells selected by the read only word lines ROWL1 through ROWLn, the read only word lines ROWL1' through ROWLn', the read column select signals RCA1 through RCAm and the read column select signals RCA1' through RCAm' can be simultaneously read via two of the read only bit lines ROBIT1 through ROBITm and the read only bit lines ROBITm through ROBITm'.

The number of data which can be simultaneously read/written is not limited to two as described above but can be set to various different numbers. Specifically, by providing m (m is a natural number) read bit lines (as write back bit lines and read only bit lines), n (n is a natural number) write bit lines, n input data lines and n write selectors so that n (which is only for write back) of the m read bit lines are connected to write bit lines via the selectors, respectively, data write to n memory cells and data read from (m-n) memory cells can be simultaneously performed and also data stored in memory cells located in the same row as a memory cell to which data is to be written can be maintained by write back.

With the above-described configuration, a general resister file having a column construction can be obtained. Particularly, in a configuration in which a large number of read ports are provided and a small number of write ports are provided, the number of circuits to be added is small, so that an area penalty can be suppressed in a simple manner.

The m bit lines may be provided so as not to be distinguished as write back bit lines or read bit lines and may be provided so that n of the m bit lines perform write back via write selectors and data read to the outside via read selectors. In this case, the total number of write data and read data may be m (or smaller) and, for example, when data write is not performed, data of m bit can be simultaneously read out.

Various combinations of the configurations described in the above embodiments may be used within a logically feasible range. Specifically, for example, the configuration of Embodiment 2 in which data to be written back is retained may be applied to the multi-port configuration shown in each of Embodiment 3 and Embodiment 4. Moreover, the configuration of each of Embodiment 2, Embodiment 3 and Embodiment 4 may be applied to the semiconductor memory device using a six-transistor memory cell which has been described in Embodiment 1.

As described above, according to the embodiments of the present invention, rewrite of only one of memory cells connected to an activated word line and the like can be performed.

What is claimed is:

1. A semiconductor memory device comprising:
   static memory cells arranged in a matrix;
   a read bit line for transmitting data read from one of the memory cells;
   a write bit line for transmitting data to be written to one of the memory cells;
   an input data line for transmitting data which is received from outside of the static memory cells; and
   a selector physically connected to the read bit line, the write bit line, and the input data line, wherein
   the selector receives a column select signal,
   the selector selects one of the read bit line and the input data line according to the column select signal, and
   the selector electrically connects the selected one to the write bit line.

2. The semiconductor memory device of claim 1, wherein the read bit line is provided plural in number and at least one of the read bit lines is connected to the selector.

3. The semiconductor memory device of claim 2, wherein each of the memory cells includes a plurality of cell output transistors connected to an associated one of the read bit lines, and a cell output transistor to be connected to said at least one of read bit lines connected to the selector has a smaller size than a size of a cell output transistor connected to other read bit lines.

4. The semiconductor memory device of claim 2, wherein m read bit lines are provided as the read bit line, where m is a natural number, n write bit lines are provided as the write bit line, where n is a natural number, n data lines are provided as the input data line, n selectors are provided as the selector, and n of the m read bit lines are connected to the selectors, respectively.

5. The semiconductor memory device of claim 1, wherein the column select signal is based on at least part of an address signal.

6. The semiconductor memory device of claim 1, wherein the column select signal is based on a write control signal received from the outside of the semiconductor memory device.

7. The semiconductor memory device of claim 1, further comprising:

a retaining circuit for retaining an input signal, wherein a signal to be received by the selector from the read bit line or a signal output from the selector to the write bit line is retained at a predetermined timing.

8. The semiconductor memory device of claim 7, wherein the signal retained by the retaining circuit is updated only in a write cycle.

* * * * *